(12) United States Patent
Thirunavukarasu et al.

(10) Patent No.: US 7,277,803 B2
(45) Date of Patent: Oct. 2, 2007

(54) EFFICIENT CALCULATION OF A NUMBER OF TRANSITIONS AND ESTIMATION OF POWER DISSIPATION IN SEQUENTIAL SCAN TESTS

(75) Inventors: Senthil Arasu Thirunavukarasu, Coimbatore (IN); Devanathan Varadarajan, Chennai (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/306,598

(22) Filed: Jan. 4, 2006

(65) Prior Publication Data

US 2007/0156356 A1    Jul. 5, 2007

(51) Int. Cl.
    *G06F 19/00*  (2006.01)
(52) U.S. Cl. .................. 702/57; 714/47; 702/186; 703/23
(58) Field of Classification Search .................. 702/57, 702/186; 714/47; 324/515, 751, 752, 753; 703/28, 23
See application file for complete search history.

(56) References Cited

U.S. PATENT DOCUMENTS 6,061,511 A * 5/2000 Marantz et al. ............ 703/28
6,501,288 B1 * 12/2002 Wilsher ..................... 324/753

OTHER PUBLICATIONS

Farid N. Najm, "A Survey of Power Estimation Techniques in VLSI Circuits", from IEEE Journal, pp. 446-455, IEEE Transactions on Very Large Scale Integration (Vlsi) Systems, vol. 2. No. 4. Dec. 1994.

Daniel Brand and Chandu Visweswariah, "naccuracies in Power Estimation During Logic Synthesis", from IEEE Journal, pp. 388-394, IBM T. J. Watson Research Center, P.O. Box 218, Yorktown Heights, NY 10598, USA, 1996.

Joseph N. Kozhaya and Farid N. Najm, "Power Estimation for Large Sequential Circuits", from IEEE journal, pp. 400-406, IEEE Transactions on Very Large Scale Integration (VLSI) Systems ,vol. 9, No. 2, Apr. 2001.

Ranganathan Sankaralingam, Rama Rao Oruganti, and Nur A. Touba, "Static Compaction Techniques to Control Scan Vector Power Dissipation", pp. 1-6, Computer Engineering Research Center, University of Texas, Austin, TX 78712-1084, 2000.

* cited by examiner

*Primary Examiner*—Michael P. Nghiem
*Assistant Examiner*—Hien Vo
(74) *Attorney, Agent, or Firm*—Alan K. Stewart; W. James Brady; Frederick J. Telecky, Jr.

(57) ABSTRACT

Determining the transition counts at various scan elements of a scan chain (for sequential scan tests) by merely examining the bits of an input vector and the expected results of evaluation. In an embodiment, assuming there are N bits of input vector (with the Nth bit being scanned in first and first bit being scanned in last) and N elements of a scan chain (with the first scan element receiving each bit first), the number of transition at Nth scan element equals an XOR of the Nth bit and the bit stored in the first scan element before scan-in operation. The number of transitions at Pth scan element then equals a sum of (XOR of (P+1)st bit and (Pth bit)) and the number of the transitions at the (P+1)st element. The transitions due to scan out operations can also be similarly determined. The computed number of transitions can be used for determining power dissipation during sequential scan test.

13 Claims, 4 Drawing Sheets

EFFICIENT CALCULATION OF A NUMBER OF TRANSITIONS AND ESTIMATION OF POWER DISSIPATION IN SEQUENTIAL SCAN TESTS

BACKGROUND OF THE INVENTION

1. Field of the Invention

The present invention relates generally to testing of integrated circuits, and more specifically to a method and apparatus for calculating a number of transitions and estimating the amount of power that would be dissipated in sequential scan tests.

2. Related Art

Sequential scan techniques are often used to test integrated circuits. According to a typical sequential scan technique, integrated circuits are designed to operate in functional mode or test mode. In functional mode, elements in the integrated circuit are connected according to a desired design and to provide a desired utility for which the integrated circuit is primarily designed.

In test mode, the integrated circuit is designed to connect various memory elements (contained in the integrated circuit) such as flip-flops in a sequence referred to as a "scan chain" (i.e., the output of one element is connected as an input to the next element). The first element in the scan chain is generally designed to receive the input bits and the last element of the scan chain is designed to scan out the results of evaluation, as described below.

In a typical scan test scenario, a number of bits in a particular pattern of zeros and ones (input vector) are sequentially (one bit at every clock cycle) loaded (scanned in) into scan chain through the first element. The number of bits contained in the input vector generally equals the number of memory elements in a corresponding scan chain.

Once a scan chain is loaded with a input vector, the elements (generally the combinatorial logic) in the integrated circuit are evaluated based on the scanned in bits. The flip-flops are designed to latch the results of the evaluation, and the bits latched in the scan chain are sequentially scanned out (one bit at every clock cycle) through the last element in the scan chain. The received scan out is compared with an expected scan out corresponding to the input vector to determine the various faults within the integrated circuit.

Many such scan chains are used to extensively test integrated circuits. The number of scan chains, as well as the lengths of the scan chains is typically larger for correspondingly complex/large designs. Each scan chain may in turn be tested with a number of input vectors. Thus, integrated circuits may be tested with a desired set of input vectors to determine whether the integrated circuits operate in a desired manner.

There is often a need to compute the number of transitions (in input and/or output of scan elements) that would occur during such sequential scan tests. For example, such numbers could be used in estimating the power that would be dissipated by integrated circuits during sequential scan tests. The estimate may be relevant, for example, because power dissipated during scan tests is often greater (since many more flip-flops would toggle) than power dissipated during normal operation (non-test duration), and the test power can potentially burn-out portions of the integrated circuit being tested.

Accordingly, the test power for each possible design of an integrated circuit is estimated, and either design or input vectors are changed to ensure that the eventual integrated circuits would operate within the power specifications during sequential scan tests. At least for such a reason, there is a need for estimation of power dissipation for a given set of input vectors.

BRIEF DESCRIPTION OF THE DRAWINGS

The present invention will be described with reference to the following accompanying drawings, which are described briefly below.

FIG. (FIG.) 1 is a block diagram of an example system in which various aspects of the present invention can be implemented.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention determines a number of transitions that would occur at each scan element of a scan chain in a sequential scan test of an integrated circuit merely by examining the input vectors that would be scanned into the scan chain. As a result, the determination can potentially be performed without examining any netlist type representations of the integrated circuits.

Such number of transitions for each scan element may be logically viewed as containing three components: (1) transitions caused due to scan-in operation; (2) transitions due to scan-out operation; and (3) transitions due to the first bit of a input vector and a last bit of the output vector (in general, the value of the first scan element before the scan-in operation). The three corresponding counts are conveniently referred to as first count, second count and third count respectively.

With respect to (1), assuming that an input vector is viewed as a sequence of N_bits, the first count is computed by comparing each Kth bit with (K+1)st bit to generate a comparison result for Kth position. The comparison result equals 1 if the compared bits are not equal and 0 otherwise, and the number of transitions at Pth scan element equals a sum of the comparison results from Pth position to (N_1)st position. The first count then equals a sum of the number of transitions that would be encountered at each scan element.

The second count (or (2) above) may also be computed using a similar approach as described in further detail in below sections. The third count (or (3) above is determined only by examining the first bit of the input vector being scanned in (Nth bit of the sequence of bits forming the input vector), and the bit stored in the first element of the scan chain prior to the scan-in operation.

According to another aspect of the present invention, an aggregate count representing a sum of the three components (for each element) is then used to estimate the power that would be dissipated during a test. In general, the power dissipation would have a positive correlation with the aggregate counts, and the estimation can be performed in a known way.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Computer System

Figure 1:
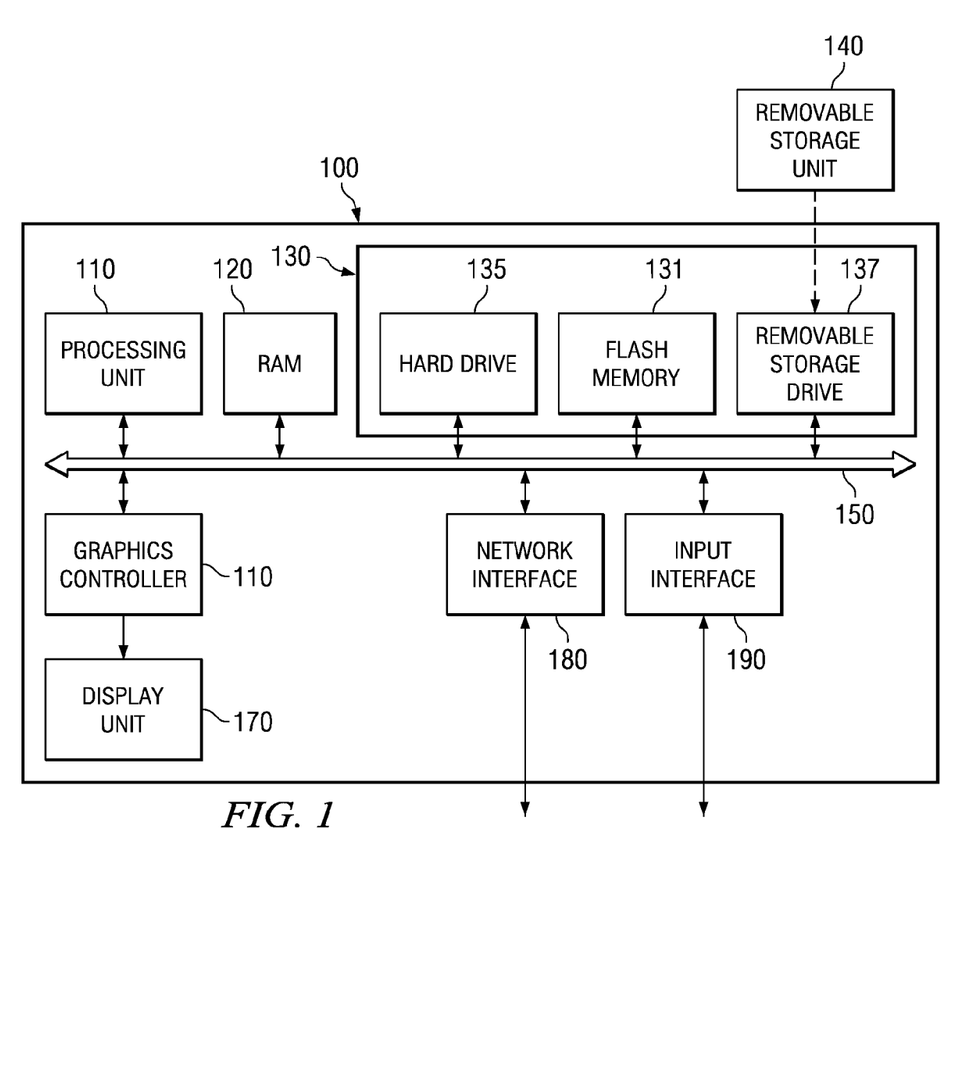

FIG. 1 is a block diagram of computer system 100 illustrating an example system in which various aspects of the present invention. The system may implement a design tool which facilitates computing of number of toggles and estimate test power based on the computed number of toggles according to various aspects of the present invention. While the description is provided with respect to a single system merely for illustration, it should be understood that the features can be implemented using several systems, as would typically be the case in the design of complex integrated circuits. Such computer systems are often networked to distribute the various tasks in design of a target integrated circuit.

Computer system 100 may contain one or more processors such as central processing unit (CPU) 110, random access memory (RAM) 120, secondary memory 130, graphics controller 160, display unit 170, network interface 180, and input interface 190. All the components except display unit 170 may communicate with each other over communication path 150, which may contain several buses as is well known in the relevant arts. The components of FIG. 1 are described below in further detail.

CPU 110 may execute instructions stored in RAM 120 to provide several features of the present invention (by performing tasks corresponding to various approaches described below). CPU 110 may contain multiple processing units, with each processing unit potentially being designed for a specific task. Alternatively, CPU 110 may contain only a single processing unit. RAM 120 may receive instructions from secondary memory 130 using communication path 150. Data representing the design (netlist) of an IC, toggle activity, input vectors, etc. (described in sections below), etc., may be stored in and retrieved from secondary memory 130 (and/or RAM 120) during execution of the instructions.

Graphics controller 160 generates display signals (e.g., in RGB format) to display unit 170 based on data/instructions received from CPU 110. Display unit 170 contains a display screen to display the images defined by the display signals.

Input interface 190 may correspond to a key_board and/or mouse, and generally enables a user to provide inputs. Network interface 180 enables some of the inputs (and outputs) to be provided on a network. In general, display unit 170, input interface 190 and network interface 180 enable a user to compute number of toggles and estimate test power according to various aspects of the present invention.

Secondary memory 130 may contain hard drive 131, flash memory 136 and removable storage drive 137. Secondary storage 130 may store the software instructions (which perform the actions described below) and data, which enable computer system 100 to provide several features in accordance with the present invention. Some or all of the data and instructions may be provided on removable storage unit 140, and the data and instructions may be read and provided by removable storage drive 137 to CPU 110. Floppy drive, magnetic tape drive, CD_ROM drive, DVD Drive, Flash memory, removable memory chip (PCMCIA Card, EPROM) are examples of such removable storage drive 137.

Removable storage unit 140 may be implemented using medium and storage format compatible with removable storage drive 137 such that removable storage drive 137 can read the data and instructions. Thus, removable storage unit 140 includes a computer readable storage medium having stored therein computer software and/or data. An embodiment of the present invention is implemented using software running (that is, executing) in computer system 100.

In this document, the term "computer program product" is used to generally refer to removable storage unit 140 or hard disk installed in hard drive 131. These computer program products are means for providing software to computer system 100. As noted above, CPU 110 may retrieve the software instructions, and execute the instructions to provide various features of the present invention described below. The features of the present invention may be clearer in comparison to a prior approach and accordingly such a prior approach is briefly described below.

3. Example Prior Power Estimation

Figure 2:
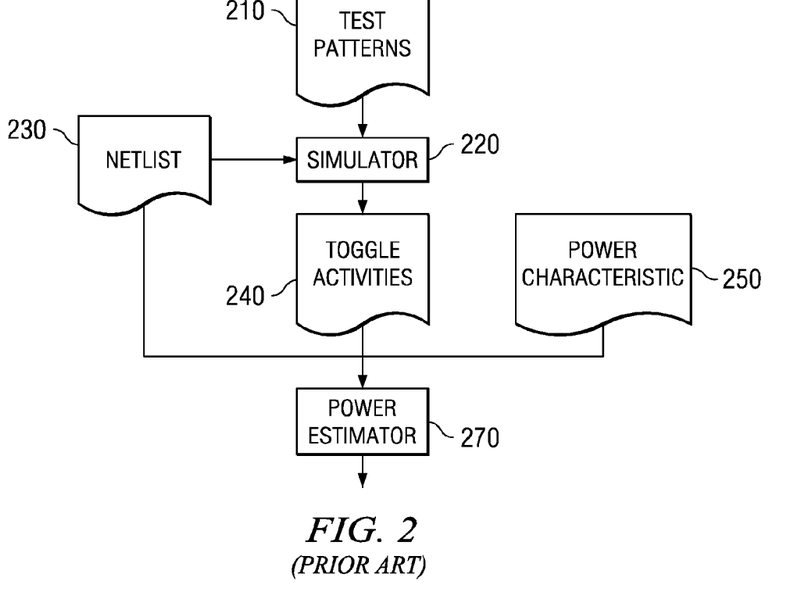
FIG. 2 is a block diagram illustrating manner in which power estimation is performed in a prior embodiment.

FIG. 2 is a block diagram illustrating manner in which power estimation is performed in a prior embodiment. The block diagram is shown containing test pattern 210, simulation block 220, netlist 230, toggle activity 240, power characteristic 250, and power estimation block 270. Each block is described below in further detail.

Test pattern 210 represents multiple sets of input vectors used for testing integrated circuits. Each set (containing a number of input vectors) of input vectors may be designed to be scanned into a corresponding scan chain. Each input vector contained in a set may test a particular operation of the portion of the integrated circuit.

Netlist 230 represents the details of the design of an integrated circuit desired to be tested in a desired data format. The details typically identify components (transistors, capacitors, memory elements, etc.) forming an integrated circuit, the details of connectivity between the components in functional mode, details of connectivity in test mode (details of scan chains and element in scan chains), input/output interface, etc.

Power characteristic 250 contains parameter values characterizing the power consumption such as operating voltage, current, supply voltage minimum, power dissipation, power consumed, etc., for various components of the integrated circuit sought to be tested. Power estimator 270 estimates the expected power dissipation of integrated circuits (once fabricated from the data using the netlist) from data in power characteristic 250 and toggle activities 240. The estimation can be performed using one of several well-known techniques.

Simulator 220 simulates the sequential scan tests using input vectors received from test pattern 210 and circuit description from netlist 230, and in the process determines the number of transitions that occur at the input/output terminal of various elements of each scan chain. In general, simulator 220 determines the effect of each operation (scanning-in a bit, scanning-out a bit, evaluation) on each component (represented by the netlist), and counts the number of transitions at each input/output terminal of interest as illustrated with respect to FIGS. 3A and 3B.

Figure 3A:
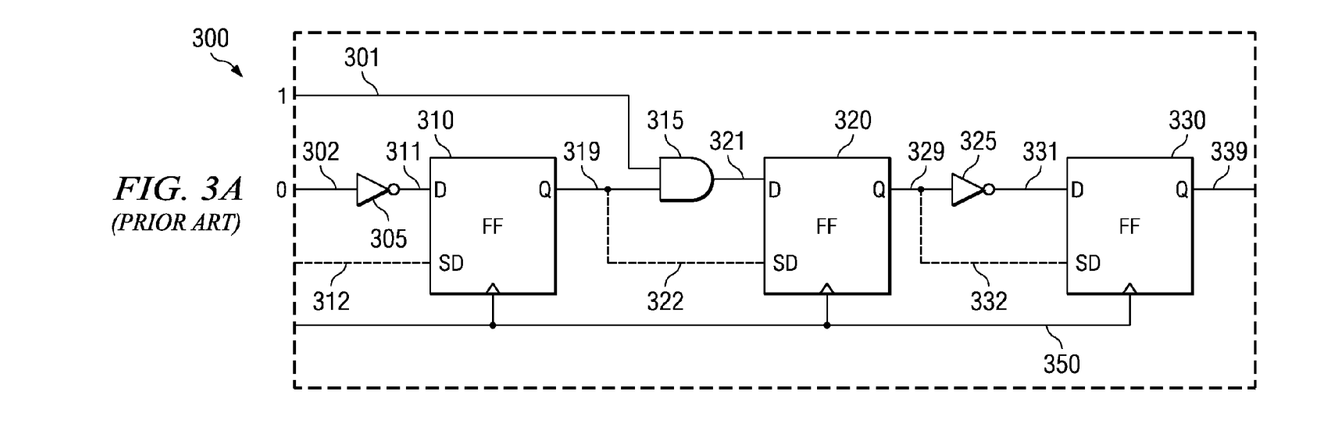
FIG. 3A is a circuit diagram illustrating the manner in which a portion of integrated circuit is simulated to determine the number of transitions at the input/output terminal of various elements in a prior embodiment.

FIG. 3A is a circuit diagram illustrating the manner in which a portion of integrated circuit is simulated to determine the number of transitions at the input/output terminal of various elements in a prior embodiment. The circuit diagram is shown containing scan elements (FF) 310, 320 and 330, AND gate 315 and NOT gates 305 and 325. Each component is described below in further detail.

Each scan element 310, 320 and 330 is shown containing two input terminals D and SD and one output terminal Q. AND gate 315 is shown having two input terminals and shown respectively connected to a first input path 301 and output Q of scan element 310. Output terminal of the AND gate is connected to D input terminal of scan element 320.

NOT gate 305 is shown connected between second input path 302 and D input of scan element 310. NOT gate 325 is shown connected between output terminal of scan element 320 and input terminal D of scan element 330. A clock signal 350 is shown provided to clock input of each scan element 310, 320 and 330.

Scan input terminal (SD) of scan elements 320 and 330 is respectively shown receiving output Q from scan element 310 and 320 (on paths 322 and 332). Scan input terminal SD of scan element 310 is shown connected to scan-in path 322. Input D is made operative when integrated circuit is operated in normal mode and input SD (scan data) is made operative when integrated circuit 200 is operated in test mode.

Accordingly, simulator 220 simulates a scan chain containing scan elements 310, 320 and 330 and paths 312, 322, 332 and 339 (as shown by dotted lines) to perform sequential scan test. Scan element 310 is referred to as a first scan element (as receiving the scan bits first) and scan element 330 as a last scan element (Nth) in the scan chain. Input vector is scanned in from path 312 and the result is scanned out from path 339.

Simulator 220 computes the number of transitions while scanning in an input vector, and scanning out the result of evaluation. Generally, while an input vector is scanned in, a result (of evaluation) from the previous input vector is scanned out in parallel. One bit of input vector is scanned in and one bit of result is scanned out at every clock cycle.

Figure 3B:
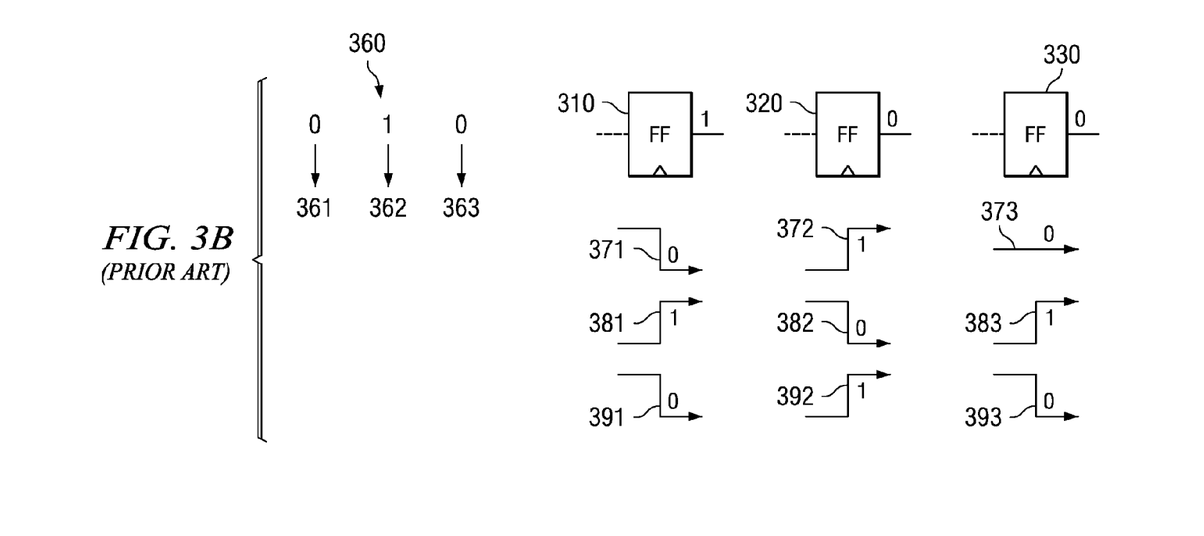
FIG. 3B is used to illustrate numerically the manner in which a portion of integrated circuit is simulated to determine the number of transitions at the input/output terminal of various elements in a prior embodiment.

The manner in which the number of transitions is computed while scanning in an example input vector 010 and scanning out a prior result 100 (or initial state) is illustrated in FIG. 3B. Shown there is a scan chain containing scan elements 310, 320 and 330, input vector 360, and transitions 371-373, 381-383, and 391-393. Each transitions is described below in further detail.

Input vector 360 is shown containing first bit 361 having value 0, second bit 362 having a value 1 and third bit 363 (example of Nth bit) having a value 0. Outputs of scan elements 310, 320, and 330 is (initially) shown storing 1, 0, and 0, respectively representing the result of evaluation performed corresponding to a previous input vector.

The row of transitions 371, 372 and 373 represent the status changes at the output of corresponding flip-flops 310, 320 and 330 when the Nth bit (363) is scanned in. Transition 371 represents a transition from logical 1 to a logical 0 at the output of scan element 310 due to scanning in of third bit (Nth) having a value 0.

Transition 372 represents a transition from logical 0 to logical 1 at the output of scan element 320. Transition 372 is caused since a logical 1 stored at the output of scan element 310 is provided as input to scan element 320. Transition 373 represents a no transition at the output of scan element 330 since the output remains at the same logic level 0. Similarly transitions 381-383 are caused due to scanning in a second bit 363 having a value 1 and transitions 391-393 are caused due to scanning in first bit 361 into scan chain.

Simulator 220 compares the output of each output terminal with the corresponding previous value, and stores data indicating that transitions 371, 381, and 391 occurred at the output of scan element 310 during sequential scan test. Similarly data indicating the occurrence of transitions 372, 382, and 392 is stored corresponding to scan element 320 and data indicating occurrence of transitions 383 and 393 is stored corresponding to scan element 330.

A total transition count due to scanning in a input vector 010 and scanning out a result 100 may be computed as 8 (3 transitions each at the out put of scan element 310 and 320 and 2 transitions at the output of scan element 330) by examining the stored data, which can then be used by power estimator 270 (as noted above).

However, it may be appreciated that determining the transition counts using simulation entails various overheads. For example, the computational complexity (and thus time required) for such a determination is relatively large since the operation of the scan chain needs to be simulated, transitions at each terminal of the elements of interest need to be determined, and the transitions need to be counted. Such overheads may not be acceptable in some environments.

In an alternative embodiment, a statistical approaches are used to estimate the number of transitions that would occur in sequential scan tests. Such techniques can lead to reduction of computational complexity, but the estimations may not be accurate to the desired level. Various aspects of the present invention overcome such disadvantages, as described below in further detail.

4. Determining the Number of Transitions

Figure 4:
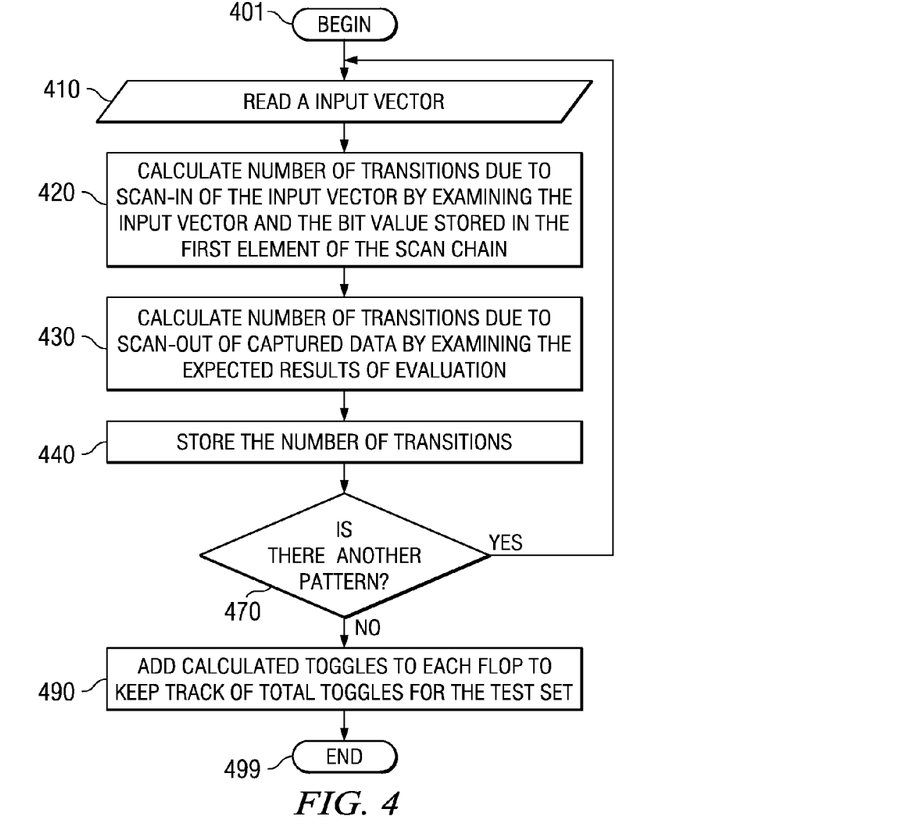
FIG. 4 is a flowchart illustrating the manner in which the number of transitions during sequential scan tests may be computed according to an aspect of the present invention.

FIG. 4 is a flowchart illustrating the manner in which the number of transitions during sequential scan tests may be computed according to an aspect of the present invention. The description is provided with respect to the above described Figures (in particular, in the system of FIG. 1) merely for illustration. However, the features can be implemented in various other environments as well. The flowchart begins in step 401, in which control transfers to step 410.

In step 410, an input vector which needs to be used for the next sequential scan test is read (or received), for example, from test patterns 210. In step 420, the number of toggles (transitions) at each scan element due to scan_in of the input vector is calculated (computed, determined) by examining the input vector and the bit value stored in the first element of the scan chain. The bit value stored in the first element may obtained from the expected results of the evaluation of previous input vector.

As described with reference to FIG. 5A, the number of transitions due to scan-in operation can be determined merely by examining the bits of the input vector as well as the bit value stored in the first element of the scan chain (i.e., 310 of FIG. 3A). By determining the number of transitions based only mere processing/examination of such bits, the computational complexity (and thus the time required) may be substantially reduced. Furthermore, since the computations can be performed in any general purpose computer system (not requiring simulator type of EDA tools), the total cost also may be reduced.

In step 430, the number of transitions due to scan_out of captured data is also computed by examining the expected result of evaluation (of the input vector already scanned in). The expected result can be determined based on the design of the integrated circuit without having to resort to simulations (typically provided along with input vectors in sequential scan tests). The manner in which the number can be determined is described below with respect to FIG. 5B.

In step 440, the number of transitions are stored, which can then used as desired, for example, for determining the power dissipation related parameters. The numbers can be stored either as individual counts for respective scan elements, or the result of additional processing (e.g., sum of some/all of the counts).

In step 470, control is transferred to step 410 if there are more input vectors (to process the next input vector), and to step 490 otherwise. Assuming that power estimator 270 requires only the aggregate number of transitions, such number is computed in step 490 based on the values stored in step 440. The method then ends in step 499.

The manner in which the number of transitions can be computed merely based on various values stored above, is described below with reference to an example.

5. Example

Figure 5A:
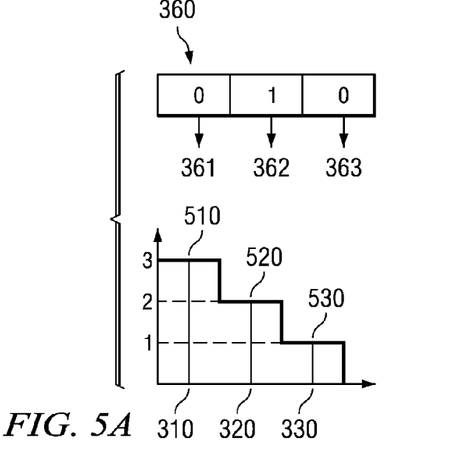
FIG. 5A is a chart illustrating the manner in which the number of transitions can be computed for each scan element by examining only the input vector.

FIG. 5A is a chart depicting the number of transitions for an example input vector, and is used to illustrate the manner in which the number of transitions can be computed for each scan elements by examining only the input vector (and the bit stored in the first scan element). The chart is described with respect to a scan chain containing scan elements 310, 320 and 330, input vector 360 and a initial bits of 1 0 0 represented in FIG. 3B. Accordingly, X-axis of the graph is shown representing example scan elements 310, 320 and 330 and the Y-axis of the chart depicts levels (510, 520 and 530) representing the number of transitions in the respective scan elements 310, 320 and 330. The Manner in which transitions are computed according to step 420 described in further detail.

Level 530 represents number of transitions occurring at the output of scan element 330. The number of transitions (level 530) is set to 1 if the third bit (Nth bit) of input vector and bit stored in the first scan element (310) are different and set to 0 if same. Accordingly, level 530 is shown representing a number of transition equaling 1. Thus, in general, the last scan element will have a number of transitions equaling 1 or 0 only.

Level 520 represents number of transition corresponding to scan element 320. The number of transitions (level 520) is set to ((XOR of third bit 363 (Nth bit) and the second bit 362 (N−1th bit))+level 530). The XOR result in this case equals 1 since Nth bit equals 0 and (N−1)st bit equals 1. Thus, level 520 is shown representing a number of transitions equaling 2 i.e., (1+1).

Level 510 represents number of transition corresponding to scan element 310. The number of transitions (level 510) is set to ((XOR of second bit 362 (N−1th bit) and the first bit 361 (N−2th bit))+level 520). The XOR result in this case equals 1 since Nth bit equals 0 and (N−1)st bit equals 1. Thus, level 510 is shown representing a number of transitions equaling 3 i.e., (1+2).

In general, the number of transition at N th scan element is set to 1/0 based on whether Nth bit of input vector and bit stored in the first scan element are different/same. And number of transition at any K th scan element NT[Kth element] is computed as:

$$NT[Kth\ element] = XOR(Kth\ bit, K+1\ bit) + NT[(K+1)th\ element]. \quad \text{Equation (1)}$$

wherein, XOR (Kth and (K+1)st bit) represents exclusive OR operation, and equals 1 if Kth and (K+1)st bit are different (having different value) and equals 0 if Kth and (K+1)st bits are same. Equations 1 is computed for K value from 0 to N−1, since transition at N th element is computed based on Nth bit of input vector and bit stored in the first scan element as noted above.

It should be appreciated that the computations of above may be viewed as having two components—(1) without considering the bit stored in the first scan element prior to a scan-in operation; and (2) with the transition caused by considering the bit stored in the first scan element.

Figure 5B:
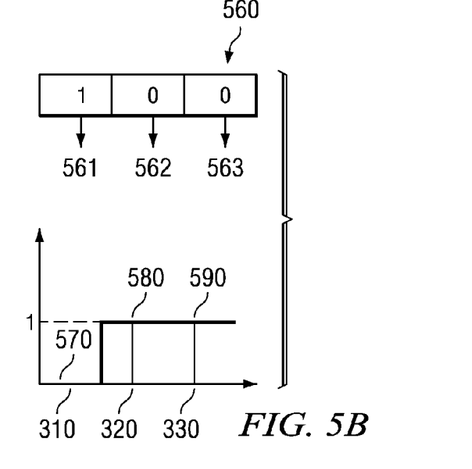
FIG. 5B is a chart illustrating the manner in which the number of transitions due to scan out of captured data are computed by examining the expected result (captured data) stored in the scan element.

Similarly, the manner in which number of transitions due to scan out of captured data are computed by examining the expected result (captured data) stored in the scan element is illustrated with reference to FIG. 5B. Shown there expected result 560, scan elements 310, 320 and 330 on X axis and number of transition (levels) 570, 580 and 590 on Y axis respectively represents number of transitions in scan element 310, 320 and 330 due to scan-out of captured result.

Level 570 is set to 0 since transition due to scan out is considered and computed while computing number of transitions due to scan in operation in FIG. 5A. The number of transitions (level 580) is set to (XOR(561, 562)+level 570). XOR(561, 562) represents XOR of bit stored in first scan element and second scan element. Accordingly XOR(561, 562) is set to 1 if the bit stored in first scan element and second scan element are different and set to 0 if same. Level 520 is shown representing a number of transition equaling 1 (0+1).

The number of transition (level 590) is set to (XOR(562, 563)+level 580). XOR(562, 563) represents XOR of bit stored in second scan element and third scan element. Accordingly XOR(562, 563) is set to 1 if the bit stored in second scan element and third scan element are different and set to 0 if same. Level 590 is shown representing a number of transition equaling 1 (1+0).

In general, the number of transition at first scan element is set to 0 and number of transition due to scan out operation at any K th scan element PT[Kth element] is computed as:

$$PT[Kth\ element] = XOR(FF(K-1), FF(K)) + PT[(K+1)th\ element]. \quad \text{Equation (2)}$$

wherein, FF(K) represents bit stored in the K th scan element. Equation 2 is computed for k value 2 to N, since number of transitions for first element is set to zero as noted above.

The transition counts thus generated be used to estimate power dissipation, as described below in further detail.

6. Estimating Power Dissipation

Figure 6:
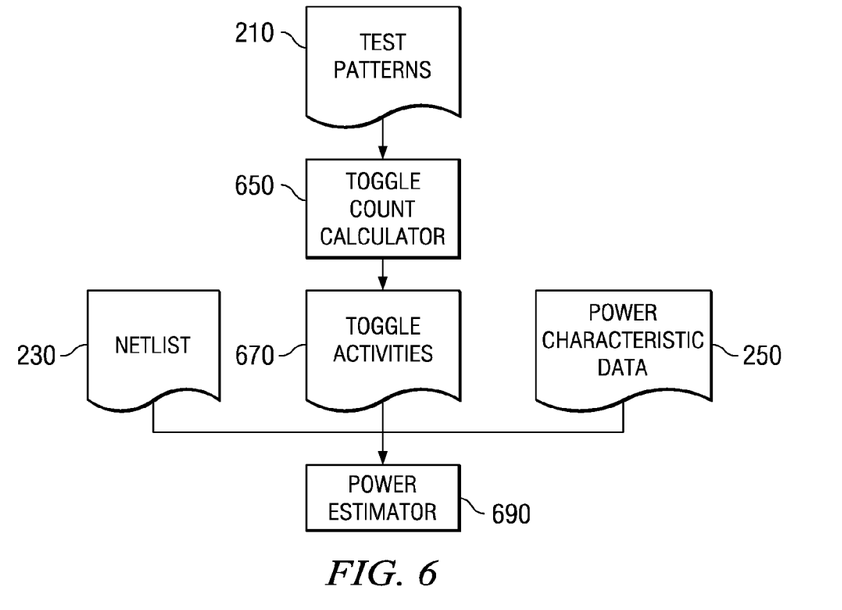
FIG. 6 is a block diagram illustrating manner in which power dissipation can be estimated according to an aspect of the present invention.

FIG. 6 is a block diagram illustrating manner in which transition count computed according to the approach described above may be used to estimate the power dissipations. For conciseness and clarity, the approach is illustrated in comparison to the approach of FIG. 2. The block diagram is shown containing test pattern 210, netlist 230, power characteristic 250, toggle count calculator 650, transition data 670 and power estimator 690.

As may be seen, the approach of FIG. 6 also uses test patterns 210 and power characterization data 250. However toggle activities 670, containing either the aggregate count of all the transitions or more detailed information (e.g., individual counts in each scan element), as desired for estimation of power dissipation by power estimator 690, is generated by toggle count calculator 650 (according to the approach(es) described above with respect to FIGS. 4, 5A and 5B). Power estimator 690 then estimates the power dissipation, as desired.

It may be appreciated that the transition counts are generated with reduced computational complexity (and also reduced cost since tools such as simulators may not be required) due to the approaches described above.

7. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A computer program embodied on a computer readable medium carrying one or more sequences of instructions to facilitate determining a number of transitions that would occur in a sequential scan test of an integrated circuit using a digital processing system, said integrated circuit comprises a plurality of scan elements which would be connected as a scan chain during said sequential scan test, wherein execution of said one or more sequences of instructions by one or more processors contained in said digital processing system causes said one or more processors to perform the actions of:

receiving an input vector; and computing a respective first count representing a number of transitions that would occur at each of said scan elements in said scan chain if said input vector is scanned-in to said scan chain, wherein said computing is performed by examining only said input vector;

receiving an expected output vector corresponding to evaluation of said integrated circuit after said first input vector is scanned-in; and calculating a respective second count representing a number of transitions that would occur in each of said scan elements in said scan chain if said expected output vector is scanned out, wherein said calculating is performed by examining only said expected output vector, wherein said expected output vector is comprised in said plurality of output vectors.

2. The computer program of claim 1, wherein said computing is performed without examining a netlist representing a design of said integrated circuit.

3. The computer program of claim 1, wherein said input vector comprises a sequence of N-bits, wherein Nth bit is scanned in first and the first bit is scanned in last into said scan chain, wherein said computing comprises:

comparing each Kth bit with (K+1)st bit in said sequence of N-bits to generate a comparison result for Kth position, wherein K equals an integer taking on values 1 to (N−1), wherein said comparison result equals 1 if the compared bits are not equal and 0 otherwise; and generating said first count at Pth scan element to equal a sum of said comparison results from Pth position to (N−1)st position.

4. The computer program of claim 1, wherein said expected output vector comprises a sequence of N-bits, wherein Nth bit is scanned out first and first bit is scanned out last from said scan chain, wherein said calculating comprises:

comparing each Kth bit with (K+1)st bit in said sequence of N-bits to generate a comparison result for Kth position, wherein K equals an integer taking on values 1 to (N−1), wherein said comparison result equals 1 if the compared bits are not equal and 0 otherwise; and generating said second count of Pth scan element to equal a sum of said comparison results from first position to Pth position.

5. The computer program of claim 4, wherein said computing further comprising generating a respective aggregate count by adding said firs count and said second count for each of said plurality of scan elements.

6. The computer program of claim 1, wherein said computing further comprising:

receiving a bit value of a first scan element in said scan chain prior to said scan-in operation; and determining a respective third count representing a number of transitions that would occur in each of said plurality of scan elements of said scan chain due to the propagation of said bit value followed by a first bit of said first input vector, wherein said determining is performed by examining only said bit value and said first bit.

7. The computer program of claim 6, wherein said computing further comprising:

determining an aggregate count equaling a sum of said first count, said second count and said third count.

8. A computer program embodied on a computer readable medium carrying one or more sequences of instructions to facilitate estimating an amount of power that would be dissipated by an integrated circuit during a sequential scan test using a digital processing system, wherein said integrated circuit comprises a plurality of scan elements which would be connected as a scan chain during said sequential scan test, wherein a plurality of input vectors would be scanned into said scan chain in a scan-in operation and a corresponding plurality of output vectors would be scanned out after corresponding evaluation of said integrated circuit in a scan-out operation during said sequential scan test, wherein execution of said one or more sequences of instructions by one or more processors contained in said digital processing system causes said one or more processors to perform the actions of:

computing a respective first count representing a number of transitions that would occur in each of said plurality of scan elements of said scan chain if a first input vector is scanned-in, wherein said computing is performed by examining only said first input vector, and wherein said first input vector is comprised in said plurality of input vectors, wherein said amount of power is estimated based on said first count;

receiving an expected output vector corresponding to evaluation of said integrated circuit after said first input vector is scanned-in; and calculating a respective second count representing a number of transitions that would occur in each of said plurality of scan elements of said scan chain if said expected output vector is scanned out, wherein said calculating is performed by examining only said expected output vector, wherein said expected output vector is comprised in said plurality of output vectors, wherein said amount of power is estimated also based on said second count.

9. The computer program of claim 8, wherein said input vector comprises a sequence of N-bits, wherein Nth bit is scanned first and first bit is scanned last into said scan chain, wherein said computing comprises:

comparing each Kth bit with (K+1)st bit in said sequence of N-bits to generate a comparison result for Kth position, wherein K equals an integer taking on values 1 to (N−1), wherein said comparison result equals 1 if the compared bits are not equal and 0 otherwise; and generating said first count at Pth scan element equals a sum of said comparison results from Pth position to (N−1)st position.

10. The computer program of claim 8, wherein said expected output vector comprises a sequence of N-bits, wherein Nth bit is scanned out first and first bit is scanned out last from said scan chain, wherein said calculating comprises:

comparing each Kth bit with (K+1)st bit in said sequence of N-bits to generate a comparison result for Kth position, wherein K equals an integer taking on values 1 to (N−1), wherein said comparison result equals 1 if the compared bits are not equal and 0 otherwise; and generating said second count at Pth scan element to equal a sum of said comparison results from first position to Pth position.

11. The computer program of claim 10, wherein said computing further comprising:

determining an aggregate count equaling a sum of said first count and said second count, wherein said amount of power is estimated based on said aggregate count.

12. The computer program of claim 10, wherein said computing further comprising:

receiving a bit value of a first scan element in said scan chain prior to said scan-in operation; and determining a third count representing a number of transitions that would occur in each said scan elements in said scan chain due to the propagation of said bit value followed by a first bit of said first input vector, wherein said determining is performed by examining only said bit value and said first bit, wherein said amount of power is estimated based on a sum of said first count, said second count and said third count.

13. The computer program of claim 8, wherein said computing is performed without examining a netlist representing a design of said integrated circuit.

* * * * *